(12) United States Patent
Klomsdorf et al.

(10) Patent No.: US 7,183,844 B2
(45) Date of Patent: Feb. 27, 2007

(54) MULTI-STATE LOAD SWITCHED POWER AMPLIFIER FOR POLAR MODULATION TRANSMITTER

(75) Inventors: Armin W. Klomsdorf, Libertyville, IL (US); Greg R. Black, Vernon Hills, IL (US); Dale G. Schwent, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 78 days.

(21) Appl. No.: 11/026,444

(22) Filed: Dec. 30, 2004

(65) Prior Publication Data

US 2006/0145758 A1    Jul. 6, 2006

(51) Int. Cl.
*H03G 3/20* (2006.01)
(52) U.S. Cl. .................... 330/129; 330/10; 330/302
(58) Field of Classification Search ............. 330/129, 330/10, 302
See application file for complete search history.

(56) References Cited

U.S. PATENT DOCUMENTS

| | | | |
|---|---|---|---|
| 5,361,403 A | 11/1994 | Dent | |
| 6,369,651 B1 * | 4/2002 | Dent | 330/127 |
| 6,438,360 B1 | 8/2002 | Alberth, Jr. et al. | |
| 6,449,465 B1 * | 9/2002 | Gailus et al. | 455/126 |
| 6,614,309 B1 * | 9/2003 | Pehlke | 330/296 |
| 6,636,112 B1 * | 10/2003 | McCune | 330/10 |
| 6,681,101 B1 * | 1/2004 | Eidson et al. | 455/127.1 |
| 6,701,134 B1 | 3/2004 | Epperson | |
| 2004/0000948 A1 | 1/2004 | Stengel et al. | |

FOREIGN PATENT DOCUMENTS

WO    WO 02/082637 A1    10/2002

* cited by examiner

*Primary Examiner*—Patricia Nguyen
(74) *Attorney, Agent, or Firm*—Charles W. Bethards

(57) ABSTRACT

A polar modulation power amplifier circuit includes a control circuit (101) to determine and provide a load selection signal (127), wherein the load selection signal (127) is determined responsive to a requested power signal (119). A power amplifier (113) is responsive to a power control signal (141), for amplifying an RF signal (139) to produce an amplified signal (145), having an output power level. A variable impedance matching circuit (117) is responsive to the load selection signal (127), to adjust a relationship between the control level and the output power level, to produce a range-adjusted amplified signal (147).

19 Claims, 2 Drawing Sheets

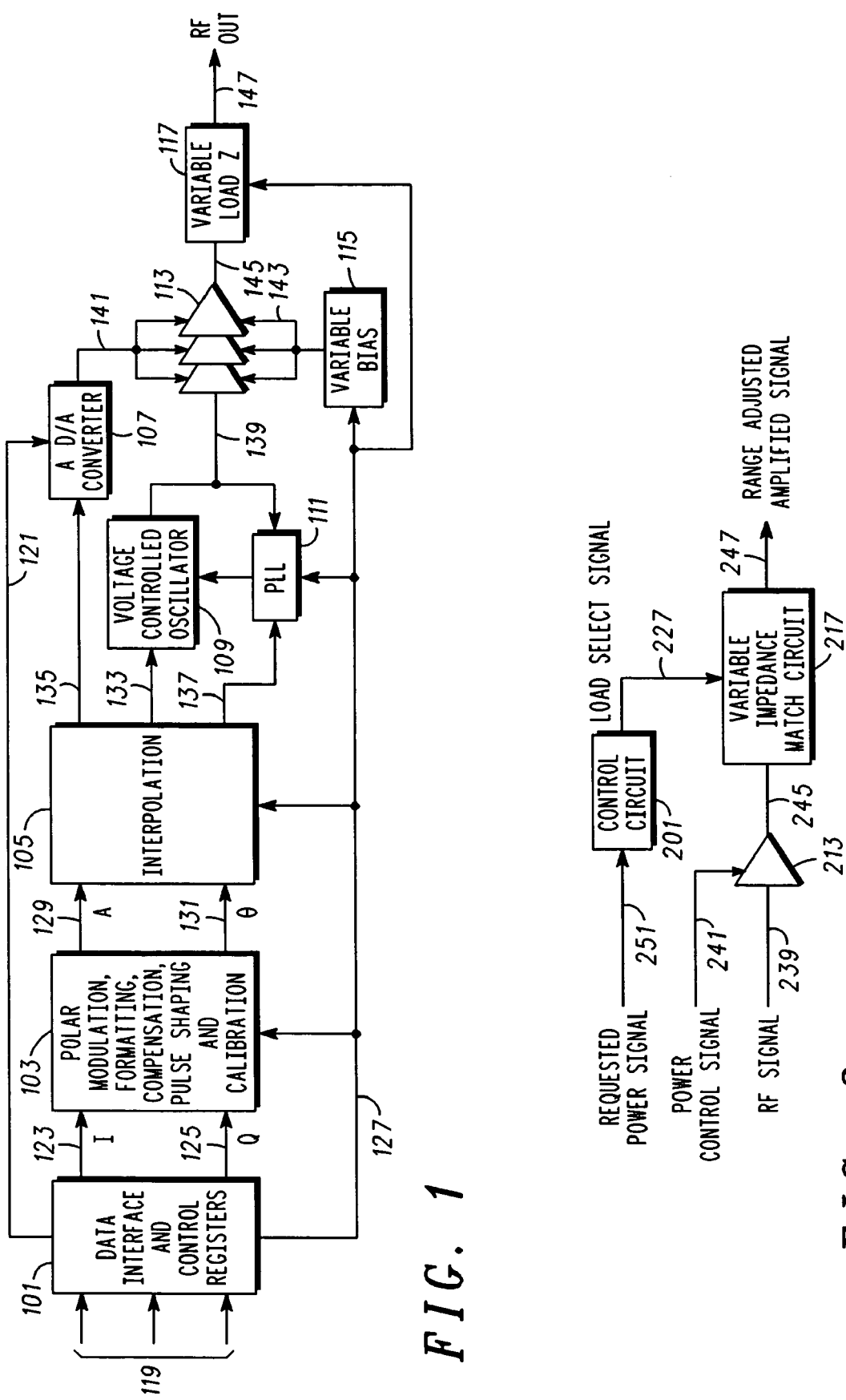

MULTI-STATE LOAD SWITCHED POWER AMPLIFIER FOR POLAR MODULATION TRANSMITTER

FIELD OF THE INVENTION

The present invention relates in general to wireless communication units and wireless networks, and more specifically to providing increased dynamic range in a polar modulation power amplifier circuit.

BACKGROUND OF THE INVENTION

In today's telecommunications industry, market forces are driving communication devices to support enhanced data rates as well as more efficient power consumption to conserve battery life. Much of the power in a communication device is consumed to support the power amplifier and associated circuits. Even when power ranges vary, power amplifiers should still operate at peak efficiency. In an effort to maximize efficiency, power amplifiers must operate near peak efficiency over the varying power ranges that can be called for in a communication device.

Where the power amplifier is incorporated in a system with a polar modulation transmitter, the demands on the power amplifier can be higher in comparison to demands on a Cartesian system, for example. In a Cartesian system, a modulated signal is amplified by a power amplifier having a power control signal for controlling the average output power to the required power level. In a polar modulation system, in addition to the usual power level control requirements, the dynamic range requirement is more demanding because the power amplifier must support an adequate dynamic range, from minimum value to maximum values. In addition, the polar system should support the modulation envelope appropriate for the transmission.

To consider a specific example, the modulation envelope for enhanced data rate for GSM system evolution (EDGE) systems requires about 16–17 dB range. In addition to the modulation envelope, EDGE requires about 30 DB of power control, for a total dynamic range of approximately 50 dB. Accordingly, the polar modulation system needs to operate at about 50 dB dynamic range if designed to work with EDGE.

Where a conventional power amplifier is utilized with a polar modulation transmitter, the power control signal magnitude is very low, i.e., near zero, at low output power levels. (This of course assumes that the power amplifier has sufficient dynamic range in the first place.) The low power control signal magnitude can exacerbate issues caused by DC offsets in the amplitude path and carrier leakage in the power amplifier, leading to high levels of signal distortion. Moreover, the conventional power amplifier does not operate as efficiently as possible at high output power, e.g., in EDGE mode, if an alternate higher output power mode, such as a GSM constant envelope mode is supported. Further, the conventional power amplifier does not operate efficiently at reduced output power levels.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

FIG. 1 is a system block diagram illustrating simplified and representative radio frequency transmitter components associated with a communication unit in accordance with various exemplary embodiments;

FIG. 2 is a system block diagram illustrating further simplified and representative radio frequency transmitter components associated with a communication unit in accordance with various exemplary embodiments;

DETAILED DESCRIPTION

Figure 3:
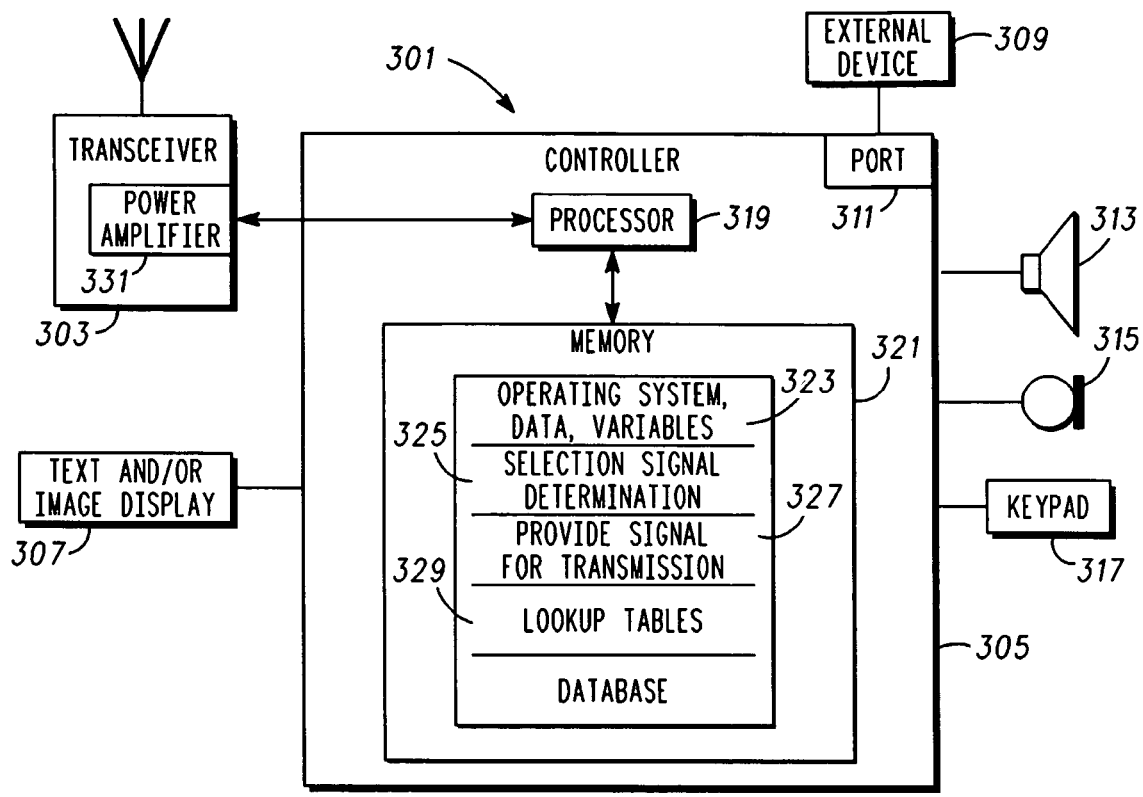
FIG. 3 is a block diagram illustrating portions of an exemplary communication unit in accordance with various exemplary embodiments.

In overview, the present disclosure concerns wireless communications devices or units, often referred to as communication units, such as cellular phone or two-way radios and the like having a transmitter capability, or components thereof. Such communication units can be associated with a communication system such as an Enterprise Network, a cellular Radio Access Network, or the like. Such communication systems may further provide services such as voice and data communications services. More particularly, various inventive concepts and principles are embodied in systems, communication units, components therefore, and methods therein for modulating a signal to produce a range-adjusted signal, in association with a transmission from a communication unit.

It should be noted that the term communication unit may be used interchangeably herein with subscriber unit, wireless subscriber unit, wireless subscriber device or the like. Each of these terms denotes a device ordinarily associated with a user and typically a wireless mobile device that may be used with a public network, for example in accordance with a service agreement, or within a private network such as an enterprise network. Examples of such units include personal digital assistants, personal assignment pads, and personal computers equipped for wireless operation, a cellular handset or device, or equivalents thereof provided such units are arranged and constructed according to the concepts and principles noted below.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

As further discussed herein below, various inventive principles and combinations thereof are advantageously employed to provide a polar modulating transmitter with a more efficient operation in bands where a higher power mode is called for, and at lower power levels in various bands and modes. This can accommodate an increased dynamic range.

Further in accordance with exemplary embodiments, there is provided a multi-state load switched power amplifier for a polar modulation transmitter. A polar modulation transmitter can include a multi-state load switch and a bias adjustment. FIG. 1 and the accompanying discussion provides a detailed description of a polar modulation power amplifier circuit and an amplifier system, in accordance with one or more embodiments, whereas FIG. 2 and the accompanying description illustrate a more general overview.

Referring now to FIG. 1, a system block diagram illustrating exemplary simplified and representative radio frequency transmitter components associated with a communication unit in accordance with various exemplary embodiments will be discussed and described. The diagram is representative of a polar modulation transmitter with multi-state load switching and bias adjustment.

Generally, signals provided on channels 119 are input into data interface and control registers circuit 101, sometimes referred to herein as a control circuit, in accordance with known standards, e.g., as specified in various 3GPP standards. Further, the signals received on the channels 119 by the control circuit 101 can include, e.g., a requested power signal received from the network in accordance with various standards, in addition to other information. The control circuit 101 outputs an in phase output signal 123 and a quadrature output signal 125. The control circuit 101 also outputs one or more selection signals, represented in the present example by the selection signal 127. A timing signal 121 can be separately provided, e.g., to a DAC (digital to analog converter) 107, and/or can be further provided in connection with, e.g., the selection signal 127. The data interface and control registers circuit 101 can include, e.g., a microprocessor and can provide the selection signal in correspondence to various ranges of requested power.

The selection signal 127 can be determined by the data interface and control registers circuit 101 in response to the input requested power signal. The selection signal 127 can correspond to a range of the input requested power signal, e.g., if the input requested power signal is in the range of 27 to 33 dBm, the selection signal 127 can have a state corresponding to "high". Multiple levels or states can be indicated by the selection signal 127. Advantageously, ranges of the requested power signal and corresponding levels or states can be provided in a lookup table in the data interface and control registers circuit 101. Accordingly, the load selection signal can have two or more states, or as in the examples discussed herein, the load selection signal can have three or more states.

As is explained in more detail below, the selection signal 127 can be utilized by subsequent components in the polar modulation transmitter to adjust bias and/or impedance levels, optionally in a step-wise manner. One or more embodiments can provide plural selection signals, e.g., a selection signal for bias and for impedance (or load), respectively. Alternative exemplary embodiments can provide a different number of levels and/or different ranges corresponding to levels for bias and for impedance. Accordingly, one or more embodiments provide that the control circuit 101 determines a load selection signal corresponding to a range of the input requested power signal.

A polar modulation, formatting, compensation, pulse shaping and calibration circuit 103 can provide modulation, formatting, compensation, pulse shaping and calibration, in accordance with known techniques. For example, the circuit 103 can map the input quadrature signals to polar coordinates, equalize amplitude and phase signals, and the like. In addition, the selection signal 127 can be utilized by the polar modulation formatting, compensation, pulse shaping and calibration circuit 103 to further adjust the input signals, e.g., selecting different calibrations, as may be needed and known.

The polar modulation formatting, compensation, pulse shaping and calibration circuit 103 can then output the polar signals, e.g., the illustrated amplitude signal 129 and phase signal 131, which are input to an interpolation circuit 105. In addition, the selection signal 127 can be utilized to further adjust the input signals at the interpolation circuit 105. The interpolation circuit 105 provides interpolation in accordance with known techniques. The interpolation circuit 105 can output a digital signal 135 which is provided to the amplitude DAC (A DAC) 107, a high frequency phase modulation component 133 which is provided to a voltage controlled oscillator circuit (VCO) 109, and a low frequency phase modulation component 137 which is provided to the phase lock loop (PLL) 111. The high frequency phase modulation component 133 and the low frequency phase modulation component 137 are pulse shaped and interpolated.

The PLL 111 and the VCO 109 are intercoupled in a known phase locked loop configuration and cooperate to provide phase modulation and to further provide an RF signal 139 at an appropriate frequency to the power amplifier (PA) 113, here illustrated as a three-stage power amplifier. Where the power amplifier has multiple stages, a power control signal 141 can be coupled to one or more of the stages of the power amplifier. The A DAC 107 adjusts the amplitude and average power, and provides the power control signal 141 to the PA 113.

In accordance with one or more embodiments, a variable bias circuit 115 receives the selection signal 127 and adjusts one or more bias points of the PA 113. The selection signal 127 indicates a level to be selected (e.g., high, mid or low). The variable bias circuit 115 can include biases to be selected, corresponding to the levels. Accordingly, one or more embodiments provide the variable bias circuit 115, responsive to the requested power signal, to adjust a bias setting of the power amplifier. Advantageously, the adjustments corresponding to the levels can be provided in a look-up table in the variable bias circuit 115, such as Table 2 discussed below. The variable bias circuit 115 can provide a signal 143 (coupled to one or more stages) to adjust the PA 113.

The PA 113 can output an adjusted RF signal 145, which is provided to a variable load Z 117 or other variable matching network. The variable matching network 117 provides additional adjustment of the RF signal 145, to provide a range-adjusted amplified signal 147. The variable matching network 117 can change the relationship between the PA's voltage input (e.g., the power control signal 141 from the A DAC 107) and the PA's RF power output (e.g., the adjusted RF signal 145). At high DC input levels, the DC voltage in and the RF voltage out (and thus the RF power out) are linearly related, but at low DC voltages this relationship is not maintained (due primarily to carrier leakage). By applying a step change, e.g., utilizing the selection signal 127, in the RF to DC voltage gain of the amplifier (in the illustrated embodiment, via the variable load Z 117), higher DC voltages are required to produce the same RF power.

The variable matching network 117 can comprise an impedance transformation network of capacitors (varactors) and inductors or transmission lines that determine the impedance transformation from the input side (driven by the PA) to the output side. The selection signal 127 can apply a bias voltage to the varactors to change their capacitance, and the change in capacitance can adjust the input impedance. One of ordinary skill in the field will appreciate such networks and realize that a particular implementation will be dependent on particular access technologies, operating frequencies, and so forth. The impedance transformation network conforms to the levels that are expected, e.g. as illustrated in Table 2. Therefore at the lowest average powers, the PA 113 is moved away from the lowest DC voltages that are most detrimental to the RF to DC voltage gain non-linearity. The relationship can be changed in a stepped manner, e.g., in coordination with two or more states that correspond to ranges of power levels.

In accordance with one or more embodiments, the channels 119 can provide a signal indicating a mode of operation of the transmitter, for example, one of a plurality of types of high data rate modes, e.g., Gaussian minimum shift keying (GMSK) and/or enhanced data rate for GSM system evolution (EDGE). Accordingly, the mode of operation can be selected from GMSK and EDGE. Advantageously, each of these can have defined power ranges, for example implemented as separate look-up tables, to support the different ranges of particular modes of operation. The selection signal 127, e.g., the load selection signal, can further be determined responsive to a mode of operation.

FIG. 1 illustrates an open loop embodiment, however, one or more alternative embodiments can be provided as a closed loop system. The power amplifier circuit can be an open loop system, or a closed loop system.

Moreover, although the example illustrates a conventional three stage power amplifier with all stages coupled to the amplitude signal, one or more embodiments can provide fewer than or more than three stages in the power amplifier; moreover, the amplitude signal need not be coupled to all power amplifier stages.

Referring now to FIG. 2, a system block diagram illustrating exemplary further simplified and representative radio frequency transmitter components associated with a communication unit in accordance with various exemplary embodiments will be discussed and described. Where components are similar to those illustrated in FIG. 1, a description thereof will be brief or omitted for the sake of simplicity. It will be appreciated that the block diagram is highly simplified.

One or more embodiments of a polar modulation power amplifier circuit, or an amplifier system with a polar modulation system can include a control circuit 201, a power amplifier (PA) 213, and a variable impedance matching circuit 217. As previously discussed in detail, the control circuit 201 can determine and provide a selection signal, e.g., a load selection signal 227, wherein the load selection signal 227 is determined responsive to a requested power signal 251. The requested power signal 251 may be, as is conventionally done, provided by the communication system. The PA 213, responsive to a power control signal 241 having a control level, can amplify an RF signal 239 to produce an amplified signal 245, having an output power level. The variable impedance matching circuit 217 is responsive to the load selection signal 227, to adjust a relationship between the control level and the output power level, to produce a range-adjusted amplified signal 247.

The requested power signal 251 can be utilized to look up corresponding values in, e.g., a look up table. The load selection signal 227 can correspond to a value from the look up table, and can be utilized by the variable impedance matching circuit 217 to perform adjustments previously described, and thus produce or provide the range-adjusted amplified signal 247.

Referring now to FIG. 3, a block diagram illustrating portions of an exemplary communication unit in accordance with various exemplary embodiments will be discussed and described. One or more embodiments of a polar modulation power amplifier circuit can be provided, e.g., in a communication device. The communication device 301 may include a transceiver 303, a speaker 313, a microphone 315, a text and/or image display 307, and/or a user input device such as a keypad 317, and one or more controllers 305. The controller 305 may include a communication port 311 for communication with an external device 309, a processor 319, and a memory 321. The transceiver can include a power amplifier 331.

The processor 319 may comprise one or more microprocessors and/or one or more digital signal processors. The memory 321 may be coupled to the processor 319 and may comprise a read-only memory (ROM), a random-access memory (RAM), a programmable ROM (PROM), and/or an electrically erasable read-only memory (EEPROM). The memory 321 may include multiple memory locations for storing, inter alia, an operating system, data and variables 323 for programs executed by the processor 319; computer programs for causing the processor to operate in connection with various functions such as selection signal determination 325, providing a signal for transmission 327, and/or other processing; storage of lookup tables 329; and a database (not numbered) for other information used by the processor 319. The computer programs may be stored, for example, in ROM or PROM and may direct the processor 319 in controlling the operation of the communication device 301.

The user may invoke functions accessible through the user input device, e.g., the keypad 317. The user input device may comprise one or more of various known input devices, such as a keypad, a computer mouse, a touchpad, a touch screen, a trackball, and/or a keyboard. The display (not illustrated) may present information to the user by way of a conventional liquid crystal display (LCD) or other visual display, and/or by way of a conventional audible device (e.g., the speaker 313) for playing out audible messages.

Responsive to signaling from the user, for example, from the microphone 315, from the user input device 317, etc. data can be prepared to be transmitted, in accordance with instructions stored in memory 321. The data can be prepared in accordance with known techniques into physical channels that are received by the processor 319. The processor 319 and the transceiver 303 can be coupled via and/or can include circuitry, e.g., components discussed above in detail, including, e.g., a power amplifier 331 that further transforms the data into a signal appropriate for transmission.

Responsive to a message received from, e.g., a network infrastructure device, via the transceiver 303, and/or as installed, lookup tables 329 can be stored for use by the processor 319 and/or other components. For example, values stored in the lookup tables 329 can be automatically utilized by the processor 319.

The processor 319 may be programmed to provide selection signal determination 325, and to provide the signal for transmission 327. Selection signal determination 325 can be responsive to the signals received over data channels, e.g., a requested power level. The requested power level signal that is provided by the channels can be used to determine a selection signal corresponding to pre-determined power ranges. (Exemplary embodiments of determining a selection signal were discussed in connection with FIG. 1.) The processor 319 can further facilitate providing the signal directly or indirectly to the transmitter, e.g., in accordance with in-line components such as the power amplifier 331, in response to the selection signal.

Figure 4:
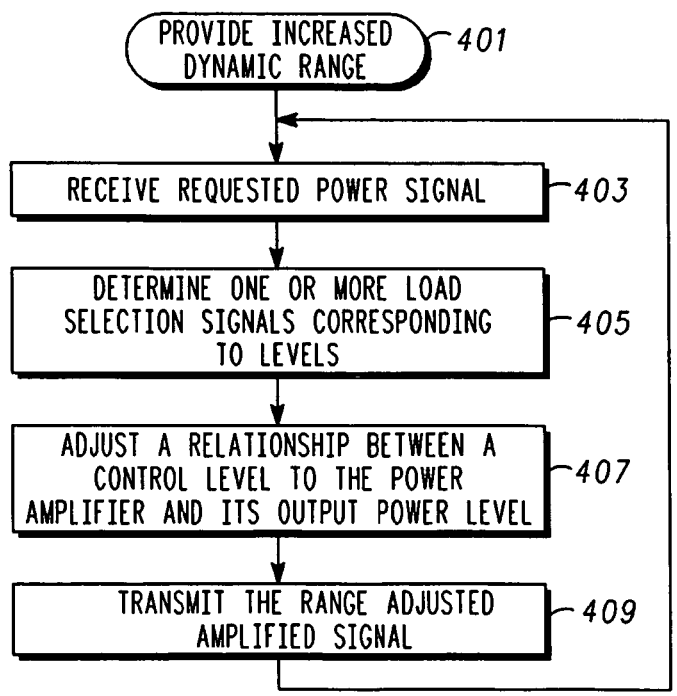
FIG. 4 is a flow chart illustrating an exemplary procedure for providing a signal with increased dynamic range in accordance with various exemplary and alternative exemplary embodiments.

Referring now to FIG. 4, a flow chart illustrating an exemplary procedure for providing a signal with increased dynamic range in accordance with various exemplary and alternative exemplary embodiments will be discussed and described. The procedure can advantageously be implemented, for example, in connection with a polar modulation circuit, described in connection with FIG. 1 or FIG. 2 or other apparatus appropriately arranged.

In overview, a process for providing increased dynamic range 401 can include receiving 403 a requested power signal; determining 405, responsive to the requested power signal, one or more load selection signals corresponding to various levels; responsive to the load selection signal, adjusting 407 a relationship between a control level to the power amplifier and an output power level thereof to produce a range-adjusted amplified signal; and transmitting 409 the range-adjusted amplified signal.

The requested power signal that is received 403 can be included as one of several signals that are conventionally provided by the system. These signals indicate the power that is requested for a particular transmission, and indicate values such as from 0 to 27 dBm when operating in an 8 PSK system.

The process for determining 405 load selection signal(s) corresponding to various levels can include, e.g., utilizing two or more states corresponding to requested power ranges of the requested power signal to determine the selection signal, e.g., the load selection signal. As previously described, the relationship 407 between the control level to the power amplifier and its output power level can be adjusted, responsive to the load selection signal. A range-adjusted amplified signal can be produced. Moreover, one or more embodiments provide for transmitting 409 the range-adjusted amplified signal.

The output power developed by the power amplifier can have the following relationship:

$$Po = \frac{Vo^2}{2RL} \leq \frac{Vcc^2}{2RL}$$

where Po is the power of the amplified signal,
Vo is the voltage of the amplified signal,
RL is the amplifier load resistance, and
Vcc is the amplifier supply voltage.

Table 1 below illustrates an example of supply voltage requirements for sweeping output power over a 50 dB dynamic range with and without a variable power amplifier matching network. For a power amplifier with a fixed matching network, the supply voltage can drop down to 13 mV. This level is representative of a bottom of an EDGE amplitude envelope at minimum output power. To prevent offset and carrier feedthrough induced errors from producing excessive composite signal distortion, equivalent DC offsets in the amplitude path can be 15 to 20 dB below this level. Advantageously, switching the matching network at 15 dBm can reduce distortion and improve efficiency at and/or below the switch point. A third matching network state (5 Ohm region in the chart below) can boost efficiency close to a maximum output power range in 8PSK mode, given that an alternate mode requires higher saturated output power. (EDGE typically uses $3\pi/8$-shifted eight-modulation, phase shifted keying modulation, frequently referred to as "8PSK.")

Table 1, Polar power amplifier supply voltage comparing fixed matching network and a stepped matching network in accordance with an exemplary embodiment (simulated values):

|  |  |  | Fixed Loadline |  | Stepped Loadline |  |
| --- | --- | --- | --- | --- | --- | --- |
| Comment | Po (DbM) | Po (mW) | $R_L$ (Ohms) | Vcc (V) | $R_L$ (Ohms) | Vcc (V) |
| (1) | 33 | 1995.26 | 2.75 | 3.31269 | 2.75 | 3.31269 |
| (2) | 30 | 1000.00 | 2.75 | 2.34521 | 5 | 3.16228 |
| (3) | 27 | 501.19 | 2.75 | 1.66028 | 5 | 2.23872 |
|  | 25 | 316.23 | 2.75 | 1.31881 | 5 | 1.77828 |
|  | 20 | 100.00 | 2.75 | 0.74162 | 5 | 1.00000 |
|  | 15 | 31.62 | 2.75 | 0.41704 | 25 | 1.25743 |
|  | 10 | 10.00 | 2.75 | 0.23452 | 25 | 0.70711 |
|  | 5 | 3.16 | 2.75 | 0.13188 | 25 | 0.39764 |
| (4) | 0 | 1.00 | 2.75 | 0.07416 | 25 | 0.22361 |
|  | −5 | 0.32 | 2.75 | 0.04170 | 25 | 0.12574 |
|  | −10 | 0.10 | 2.75 | 0.02345 | 25 | 0.07071 |
| (5) | −15 | 0.03 | 2.75 | 0.01319 | 25 | 0.03976 |

Where
row (1) is a GMSK Maximum Po;
row (2) is a top of an 8PSK envelope;
row (3) is an 8PSK maximum RMS Po;
row (4) is the GMSK and 8 PSK minimum Po; and
row (5) is a bottom of the 8PSK envelope.

Table 2 below is a simplified state table illustrating operation of one or more embodiments, where in this example, the polar modulation transmitter can be operated with two (or more) operation modes:

| Mode | Power Range | PA Loadline | PA Bias |
| --- | --- | --- | --- |
| GMSK | High (27 to 33 dBm) | Low $R_L$ | High |
| 8PSK | Mid (15 to 27 dBm) | Mid $R_L$ | Mid |
| 8PSK | Low (0 to 15 dBc) | High $R_L$ | Low |

Where one or more embodiments are operating with EDGE, the range-adjusted amplified signal can accommodate a dynamic range of about 50 dB.

The communication systems and communication units of particular interest are those providing or facilitating voice communications services or data or messaging services over cellular wide area networks (WANs), such as conventional two way systems and devices, various cellular phone systems including digital cellular systems where a wide range of powers may be required from a power amplifier. These systems may include one or more of a CDMA (code division multiple access) and variants thereof, GSM (Global System for Mobile Communications), GPRS (General Packet Radio System), Enhanced Data rate for GSM system Evolution (EDGE), 2.5G and 3G systems such as UMTS (Universal Mobile Telecommunication Service) systems, Internet Protocol (IP) Wireless Wide Area Networks like 802.16, 802.20 or Flarion, integrated digital enhanced networks and variants or evolutions thereof.

Furthermore the wireless communication units or devices of interest may have one or more short range wireless communications capabilities normally referred to as WLAN (wireless local area network) capabilities, such as IEEE 802.11, Bluetooth, or Hiper-Lan and the like preferably using CDMA, frequency hopping, OFDM (orthogonal frequency division multiplexing) or TDMA (Time Division Multiple Access) access technologies.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. Many such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A polar modulation power amplifier circuit comprising:
    a control circuit to determine and provide a load selection signal, wherein the load selection signal is determined responsive to a requested power signal and wherein the load selection signal has at least two states;
    a power amplifier, responsive to a power control signal having a control level, for amplifying an RF signal to produce an amplified signal, having an output power level; and
    a variable impedance matching circuit, responsive to the load selection signal, to adjust a relationship between the control level and the output power level, to produce a range-adjusted amplified signal.

2. The power amplifier circuit of claim 1, wherein the control circuit determines the load selection signal corresponding to a range of the requested power signal.

3. The power amplifier circuit of claim 1, wherein the circuit is an open loop system.

4. The power amplifier circuit of claim 1, wherein the circuit is a closed loop system.

5. The power amplifier circuit of claim 1, wherein the load selection signal has at least three states.

6. The power amplifier circuit of claim 1, wherein the power amplifier has multiple stages, and wherein the power control signal is coupled to at least one of the stages of the power amplifier.

7. The power amplifier circuit of claim 1, wherein the range-adjusted amplified signal accommodates a dynamic range of about 50 dB.

8. The power amplifier circuit of claim 1, further comprising a variable bias circuit, responsive to the requested power signal, to adjust a bias setting of the power amplifier.

9. The power amplifier circuit of claim 1, wherein the load selection signal is further determined responsive to a mode of operation.

10. The power amplifier circuit of claim 9, wherein the mode of operation is selected from one of Gaussian minimum shift keying (GMSK) and enhanced data rate for GSM system evolution (EDGE).

11. A method for providing increased dynamic range, performed in a polar modulation power amplifier circuit, comprising:
    receiving a requested power signal;
    determining, responsive to the requested power signal, a load selection signal, wherein the load selection signal has at least two states;
    responsive to the load selection signal, adjusting a relationship between a control level to the power amplifier and an output power level thereof to produce a range-adjusted amplified signal.

12. The method of claim 11, wherein the determining utilizes a plurality of states corresponding to requested power ranges of the requested power signal to determine the load selection signal.

13. The method of claim 11, further comprising transmitting the range-adjusted amplified signal.

14. The method of claim 11, further comprising providing the polar modulation power amplifier circuit in a communication device.

15. An amplifier system, comprising:
    a controller, receiving an input power level signal, for producing at least one selection signal, the selection signal having at least two states;
    a power amplifier circuit in a polar modulation system, the power amplifier circuit being responsive to a power control signal and producing an output RF signal; and
    a variable impedance network coupled to the output of the power amplifier circuit, the variable impedance network for presenting one of a plurality of impedances to the output RF signal of the signal amplifier responsive to the at least one selection signal, to produce an adjusted output signal.

16. The amplifier system of claim 15, further comprising a variable bias adjustment circuit coupled to the at least one selection signal, to further adjust a relationship between a control level of the power amplifier circuit and a power output thereof, responsive to the at least one selection signal.

17. The amplifier system of claim 15, wherein the at least one selection signal corresponds to one of a plurality of power ranges.

18. The amplifier system of claim 17, wherein there are provided three power ranges.

19. The amplifier system of claim 15, wherein a dynamic range of the adjusted output signal can cover an enhanced data rate for GSM system evolution (EDGE) amplitude envelope.

* * * * *